United States Patent
Marzaki et al.

(10) Patent No.: US 10,943,862 B2
(45) Date of Patent: Mar. 9, 2021

(54) INTEGRATED FILLER CAPACITOR CELL DEVICE AND CORRESPONDING MANUFACTURING METHOD

(71) Applicants: STMicroelectronics (Rousset) SAS, Rousset (FR); STMicroelectronics (Crolles 2) SAS, Crolles (FR)

(72) Inventors: Abderrezak Marzaki, Aix en Provence (FR); Arnaud Regnier, Les Tallades (FR); Stephan Niel, Meylan (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/242,529

(22) Filed: Jan. 8, 2019

(65) Prior Publication Data
US 2019/0214341 A1    Jul. 11, 2019

(30) Foreign Application Priority Data
Jan. 9, 2018    (FR) ...................................... 1850157

(51) Int. Cl.
*H01L 23/522*    (2006.01)
*H01L 21/762*    (2006.01)
(Continued)

(52) U.S. Cl.
CPC ...... *H01L 23/5223* (2013.01); *H01L 21/0214* (2013.01); *H01L 21/76224* (2013.01);
(Continued)

(58) Field of Classification Search
CPC ........................ H01L 29/66181; H01L 29/945
See application file for complete search history.

(56) References Cited

U.S. PATENT DOCUMENTS

| 5,581,110 A | 12/1996 | Razouk et al. |
| 5,805,494 A | 9/1998 | El-Kareh et al. |

(Continued)

FOREIGN PATENT DOCUMENTS

| EP | 1335425 A1 | 8/2003 |
| FR | 2894708 A1 | 6/2007 |

(Continued)

OTHER PUBLICATIONS

INPI Search Report and Written Opinion for FR 1850157 dated Sep. 10, 2018 (8 pages).

(Continued)

*Primary Examiner* — Moazzam Hossain
(74) *Attorney, Agent, or Firm* — Crowe & Dunlevy

(57) ABSTRACT

A semiconductor region includes an isolating region which delimits a working area of the semiconductor region. A trench is located in the working area and further extends into the isolating region. The trench is filled by an electrically conductive central portion that is insulated from the working area by an isolating enclosure. A cover region is positioned to cover at least a first part of the filled trench, wherein the first part is located in the working area. A dielectric layer is in contact with the filled trench. A metal silicide layer is located at least on the electrically conductive central portion of a second part of the filled trench, wherein the second part is not covered by the cover region.

17 Claims, 9 Drawing Sheets

(51) Int. Cl.
*H01L 21/02* (2006.01)
*H01L 21/8238* (2006.01)
*H01L 29/94* (2006.01)
*H01L 29/66* (2006.01)
*H01L 27/08* (2006.01)

(52) U.S. Cl.
CPC ............ *H01L 21/823878* (2013.01); *H01L 21/823892* (2013.01); *H01L 27/0805* (2013.01); *H01L 29/66181* (2013.01); *H01L 29/945* (2013.01)

(56) References Cited

U.S. PATENT DOCUMENTS

| | | | |
|---|---|---|---|
| 6,391,707 B1 | 5/2002 | Dirnecker et al. | |
| 7,022,565 B1* | 4/2006 | Kao | H01L 27/0629 257/E21.019 |
| 7,449,744 B1 | 11/2008 | Yu et al. | |
| 8,085,524 B2 | 12/2011 | Roozeboom et al. | |
| 8,492,820 B2 | 7/2013 | Anderson et al. | |
| 8,525,245 B2 | 9/2013 | Erickson et al. | |
| 8,816,470 B2 | 8/2014 | Erickson et al. | |
| 9,159,723 B2 | 10/2015 | Chou et al. | |
| 9,178,080 B2 | 11/2015 | Kalnitsky et al. | |
| 9,349,793 B2 | 5/2016 | Jaffe et al. | |
| 9,978,829 B2 | 5/2018 | Lin | |
| 10,049,890 B2 | 8/2018 | Chou et al. | |
| 10,084,035 B2 | 9/2018 | Papavasiliou et al. | |
| 10,109,601 B2 | 10/2018 | Marzaki | |
| 2002/0019110 A1* | 2/2002 | Lee | H01L 21/02337 438/398 |
| 2006/0124982 A1* | 6/2006 | Ho | H01L 27/0805 257/304 |
| 2007/0054461 A1 | 3/2007 | Su | |
| 2007/0278612 A1 | 12/2007 | Williams et al. | |
| 2009/0039466 A1 | 2/2009 | Sanada | |
| 2009/0095998 A1* | 4/2009 | Ho | H01L 29/66181 257/301 |
| 2011/0018094 A1 | 1/2011 | Chapman et al. | |
| 2011/0165755 A1* | 7/2011 | Zundel | H01L 21/743 438/386 |
| 2011/0298085 A1* | 12/2011 | Terletzki | H01L 27/0207 257/516 |
| 2012/0032260 A1 | 2/2012 | Hirler et al. | |
| 2013/0069198 A1 | 3/2013 | Claeys et al. | |
| 2013/0161792 A1 | 6/2013 | Tran et al. | |
| 2014/0061780 A1 | 3/2014 | Son et al. | |
| 2014/0117499 A1* | 5/2014 | Yang | H01L 29/92 257/532 |
| 2014/0145299 A1 | 5/2014 | Kalnitsky et al. | |
| 2014/0264523 A1* | 9/2014 | Loechelt | H01L 29/0878 257/301 |
| 2015/0061075 A1 | 3/2015 | Yeh | |
| 2015/0236031 A1 | 8/2015 | Mantelli et al. | |
| 2016/0020267 A1 | 1/2016 | Lin | |
| 2016/0218071 A1 | 7/2016 | Nam et al. | |
| 2019/0074363 A1 | 3/2019 | Zhu | |

FOREIGN PATENT DOCUMENTS

FR  3013148 A1  5/2015
FR  3021457 A1  11/2015

OTHER PUBLICATIONS

La Rosa, F., et al.: "40nm Embedded Select in Trench Memory (eSTM) Technology Overview," 2019 IEEE 11th International Memory Workshop, 4 pages.

* cited by examiner

INTEGRATED FILLER CAPACITOR CELL DEVICE AND CORRESPONDING MANUFACTURING METHOD

PRIORITY CLAIM

This application claims the priority benefit of French Application for Patent No. 1850157, filed on Jan. 9, 2018, the content of which is hereby incorporated by reference in its entirety to the maximum extent allowable by law.

TECHNICAL FIELD

Embodiments and applications relate to integrated circuits, particularly filler capacitor cells (or "filler capacitors") which occupy the empty spaces of integrated circuits and may be used, for example, as decoupling capacitors.

BACKGROUND

Filler capacitor cells are commonly used, notably, in logic parts of integrated circuits.

As shown in FIG. 1, which is a top view of part of an integrated circuit, the logic parts LG of an integrated circuit comprise an alternation of n-type semiconductor wells NW and p-type semiconductor wells PW, in which the logic gates made by complementary technology (CMOS) are formed.

For reasons of architecture, the logic part LG comprises empty spaces in which no logic gates are formed. Filler capacitor cells FC are then formed in these empty spaces, in order to optimize the use of the surface of the logic part.

Filler capacitor cells FC are used, for example, to supplement decoupling capacitors DECAP located at the edge of the logic part LG, the overall dimensions of which are usually already large.

FIG. 2 shows a sectional view of a filler capacitor cell 200 comprising trenches 20 filled with a conductive material 21 enclosed by an isolating enclosure 22. The trenches 20 are located in a working area of a well NW of the logic part LG of an integrated circuit.

The working area is a region that is not covered by shallow isolation trenches STI, and is usually intended to receive active elements of integrated circuits such as transistors.

The well NW forms a first electrode E1 of the capacitor, intended to be coupled to a supply voltage, and the conductive material 21 filling the trenches 20 forms a second electrode E2 of this capacitor, intended to be coupled to a reference voltage.

The substrate or well PW is usually connected to the second electrode E2, forming a reverse diode with the well NW to prevent current leakage between the two electrodes E1, E2 of the capacitor 200.

This type of architecture using trenches 20 provides a better surface capacitance than a conventional architecture in which the second electrode covers the surface of the working area of the well NW.

However, a step of silicidation (that is to say, the formation of a layer of metal silicide), an essential part of the manufacturing methods, generates a film of metal silicide 28 on the surfaces of the exposed parts of the working area and of the conductive material 21 filling the trenches 20.

Although it is relatively thick (from 8 to 10 nm, for example), the isolating enclosure 22 separating the well NW and the conductive material 21 filling the trenches 20 is short-circuited (29) by the metal silicide film 28, as a result of surface edge effects.

The short circuits 29 reduce the surface capacitance and cause high current leakage between the two electrodes E1, E2 of the capacitor 200.

Consequently there is a need to overcome these drawbacks and to propose a compact filler capacitor cell device that reduces current leakage as far as possible.

SUMMARY

In an embodiment, an integrated circuit comprises at least one domain comprising at least one filler capacitor cell device, the device comprising: a first semiconductor region; an isolating region delimiting a working area of the first semiconductor region; at least one trench located in said working area and extending into the isolating region, the trench having a central electrically conductive portion enclosed by an isolating enclosure; a cover region covering at least a first part of said trench, the first part of said trench being the part located in said working area, the cover region comprising at least one dielectric layer in contact with said trench; a metal silicide layer located at least on the central portion of a second part of said trench, the second part of said trench being a part not covered by the cover region; a first contact in the first semiconductor region, forming a first electrode of the device; and a second contact on the metal silicide layer of the central portion of the second part of said trench.

Thus, with the cover region covering the central portion, at least on the part thereof located in the working area, the device is protected from short circuits between a surface metal silicide layer of the working area and a surface metal silicide layer of the central portion.

A part of the central portion that is not covered by the cover region, that is to say a part located in the isolating region, may, however, receive a metal silicide layer for connecting a second contact.

According to one embodiment, in which the integrated circuit comprises a substrate and a well housed in the substrate and forming said first semiconductor region, the device further comprises a substrate contact electrically connected to the second contact.

According to one embodiment, the cover region comprises an electrically conductive layer surmounting said dielectric layer and electrically connected to the second contact.

Such an electrically conductive layer of the cover region makes it possible, notably, to increase the capacitance of the capacitor device. This is because, with a parallel capacitive element comprising the first semiconductor region, the dielectric layer of the cover region and the electrically conductive layer of the cover region may thus be formed at no additional cost.

According to one embodiment, said dielectric layer of the cover region comprises a transistor gate oxide layer.

According to one embodiment, said dielectric layer of the cover region comprises a stack of oxide-nitride-silicon oxide layers.

According to one embodiment, the device comprises a plurality of parallel trenches in the working area.

According to one embodiment, said cover region takes the form of a plate covering the whole surface of the working area.

According to one embodiment, the device comprises a plurality of cover regions in the form of strips positioned facing each trench respectively.

For example, in this embodiment, the metal silicide layer may also be located on the surface of the working area, between said strips.

According to one embodiment, said domain comprises logic gates.

According to one embodiment, said domain comprises a sequence of wells in the substrate, and a plurality of capacitor cell devices located between logic gates.

Also proposed is an electronic apparatus such as a mobile phone or an on-board computer of a vehicle, comprising an integrated circuit as defined above.

According to another aspect, a method is proposed for manufacturing at least one filler capacitor cell device, in a domain of an integrated circuit, comprising: the formation of a first semiconductor region; the formation of an isolating region delimiting a working area of the first semiconductor region; the formation of at least one trench located in said working area and extending into the isolating region, comprising the etching of at least one trench, the formation of an isolating enclosure on the bottom and sides of said trench, and the formation of the cover region, comprising the formation of an electrically conductive central portion enclosed in said isolating enclosure; the formation of a cover region covering at least a first part of said trench, the first part of said trench being the part located in said working area, comprising the formation of a dielectric layer in contact with said trench; the formation of a metal silicide layer located at least on the central portion of a second part of said trench, the second part of said trench being a part not covered by the cover region; the formation of a first contact in the first semiconductor region to form a first electrode of the device; and the formation of a second contact on the metal silicide layer of the central portion of the second part of said trench.

Thus, at the time of the formation of metal silicide, with the cover region covering the central portion, at least on the part thereof located in the working area, the device is protected from short circuits between a surface metal silicide layer of the working area and a surface metal silicide layer of the central portion. This is because the formation of metal silicide films usually affects all the exposed parts of the silicon elements.

A part of the central portion that is not covered by the cover region, that is to say a part located in the isolating region, may, however, receive a metal silicide layer for connecting a second contact.

According to one embodiment, the formation of a first semiconductor region comprises the formation of a well in a substrate, the method further comprising the formation of a substrate contact electrically connected to the second contact.

According to one embodiment, the formation of the cover region comprises the formation of an electrically conductive layer surmounting said dielectric layer and electrically connected to the second contact.

According to one embodiment, the formation of the dielectric layer of the cover region comprises the formation of a transistor gate oxide layer.

According to one embodiment, the formation of the dielectric layer of the cover region comprises the formation of a stack of oxide-nitride-silicon oxide layers.

According to one embodiment, said formation of at least one trench comprises the formation of a plurality of parallel trenches located in said working area and extending into the isolating region.

According to one embodiment, said formation of at least one cover region is configured to form a plate covering the whole surface of the working area.

According to one embodiment, said formation of at least one cover region is configured to form strips arranged facing each trench.

BRIEF DESCRIPTION OF THE DRAWINGS

Other advantages and characteristics of the invention will be apparent from a perusal of the detailed description of embodiments and applications, which are not limiting in any way, and the appended drawings, in which.

DETAILED DESCRIPTION

Figure 1:
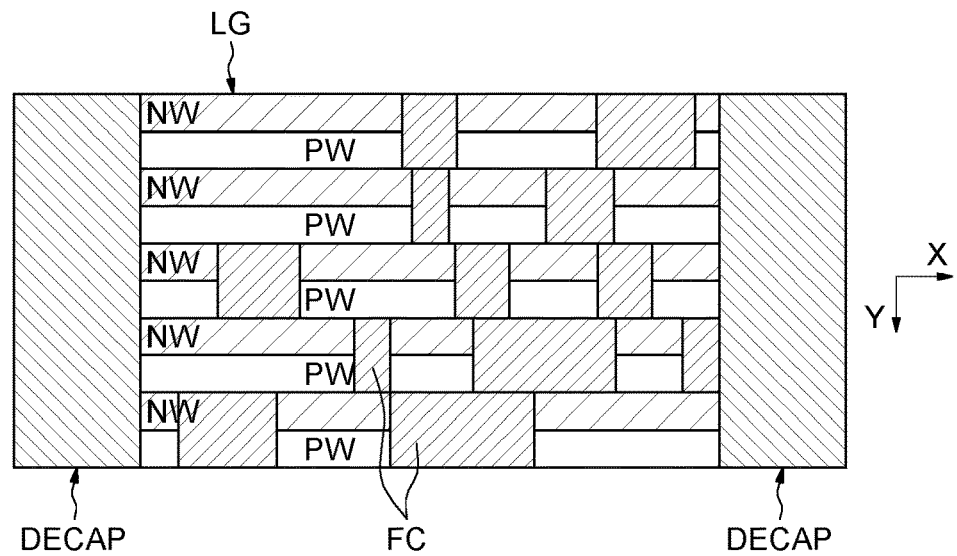
FIGS. 1 and 2, described above, show examples of commonly used filler capacitor cells.
Figure 2:
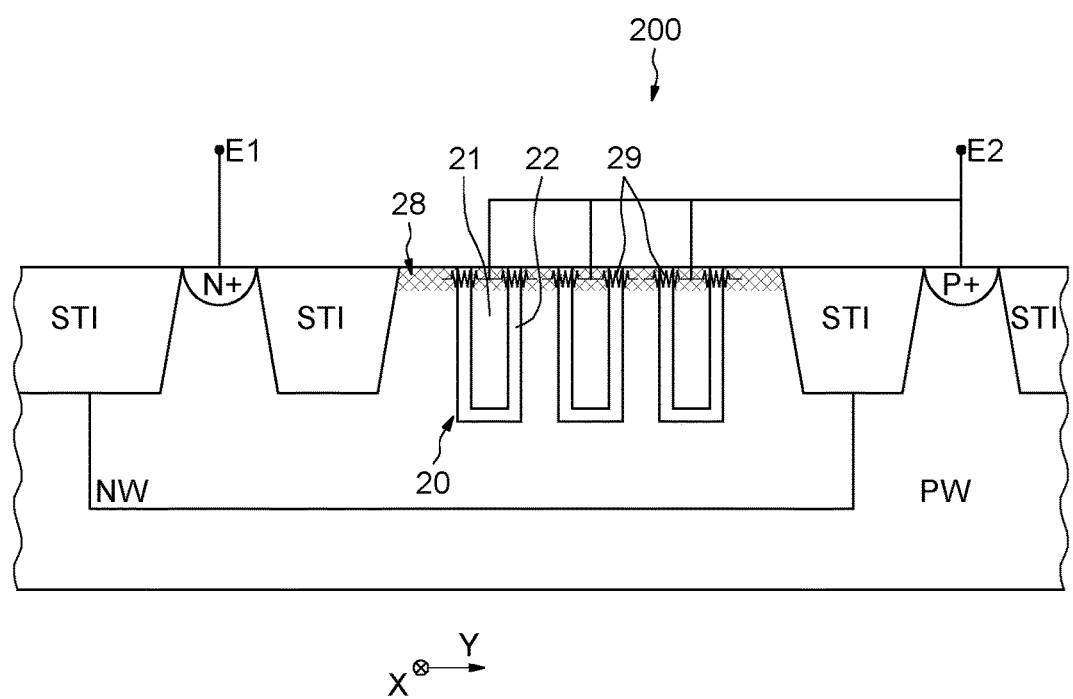
Figure 3A:
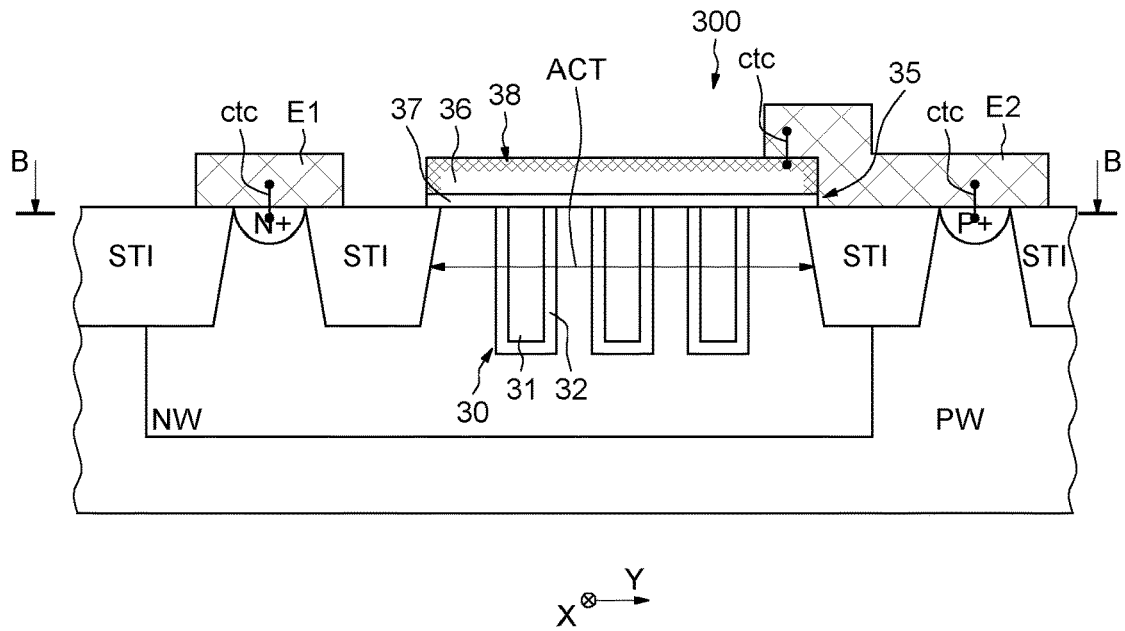
FIGS. 3A to 3C show an example of an embodiment of a filler capacitor cell.
Figure 3B:
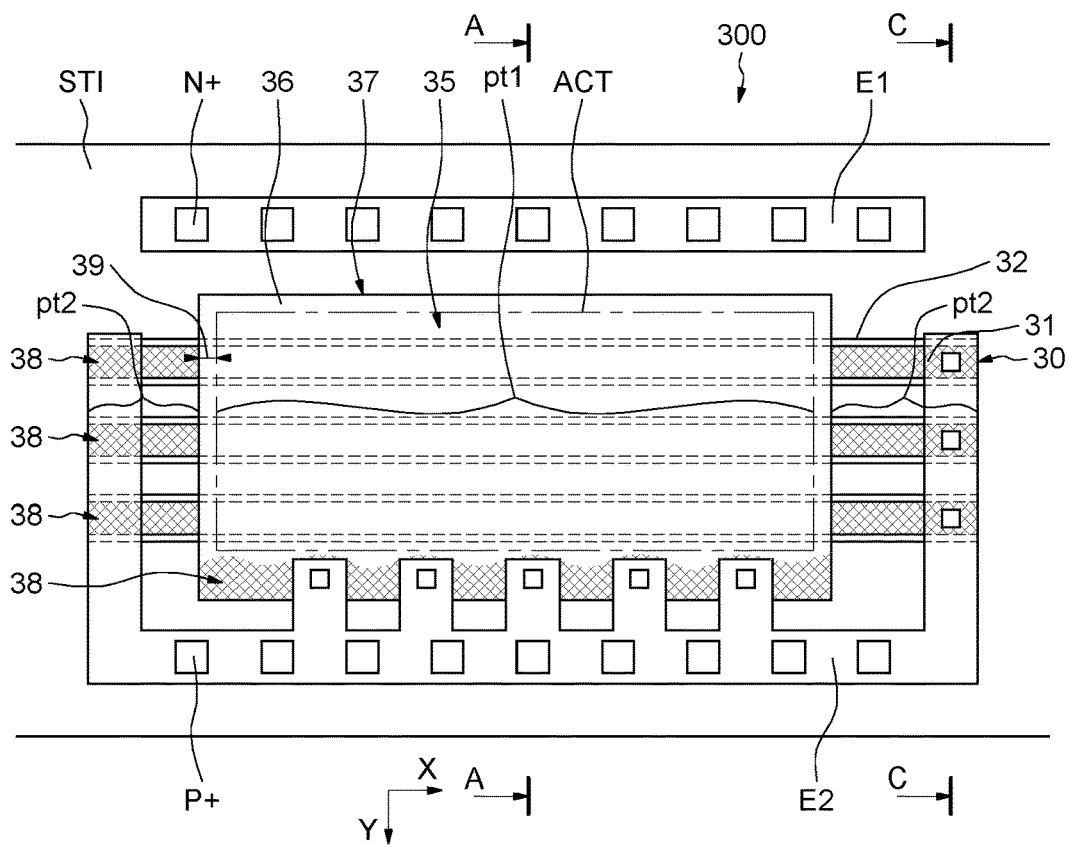
Figure 3C:
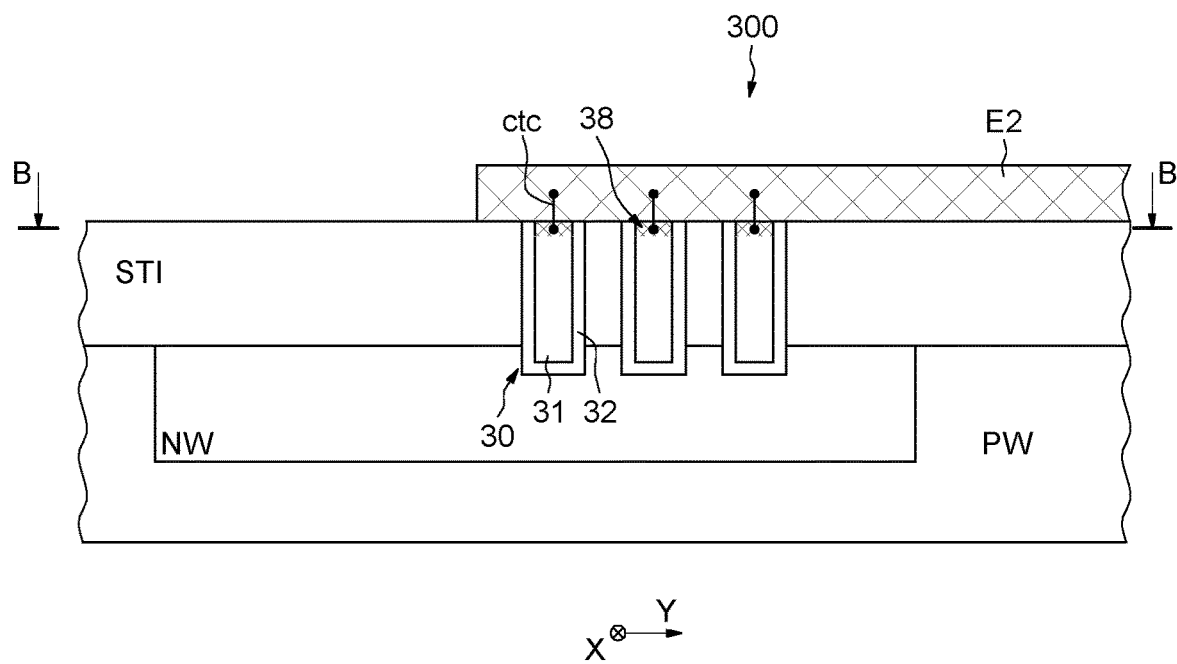

FIGS. 3A, 3B and 3C show an example of an embodiment of a filler capacitor cell 300.

FIG. 3A is a sectional view, in the plane AA of FIG. 3B, of the filler capacitor cell 300, FIG. 3B is a top view, in the plane BB of FIGS. 3A and 3C, of the filler capacitor cell 300, and FIG. 3C is a sectional view, in the plane CC of FIG. 3B, of the filler capacitor cell 300.

Figure 4A:
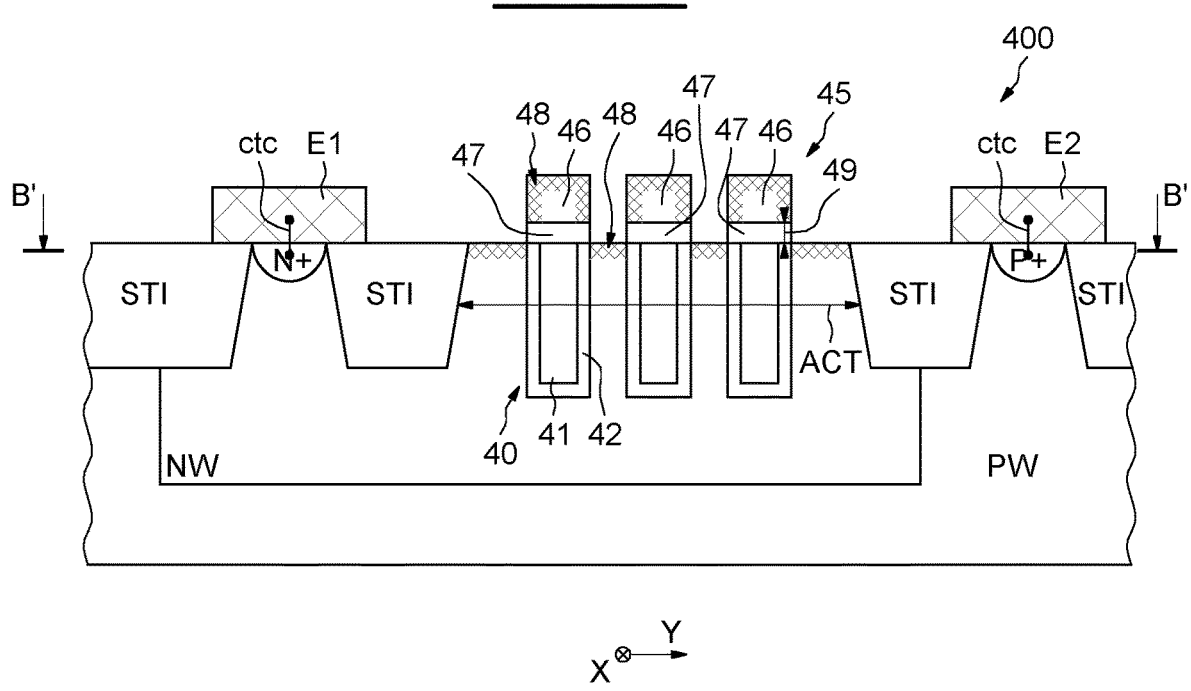
FIGS. 4A to 4C show an example of an embodiment of a filler capacitor cell.
Figure 4B:
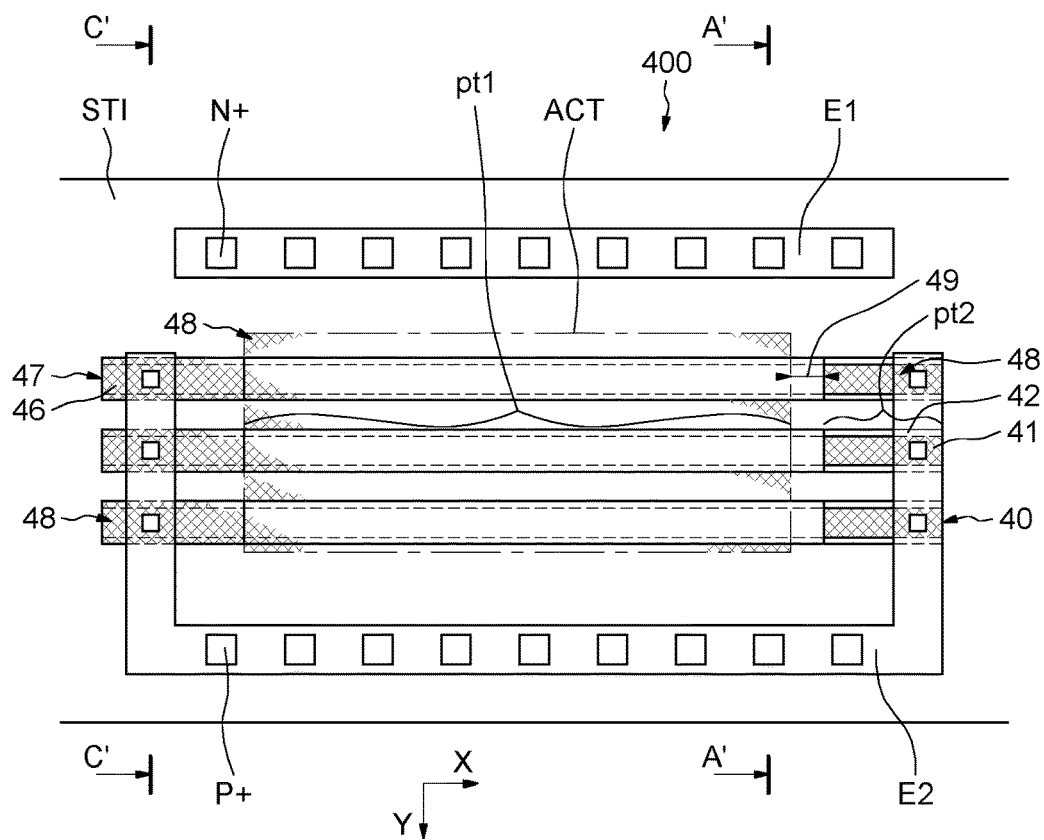
Figure 4C:
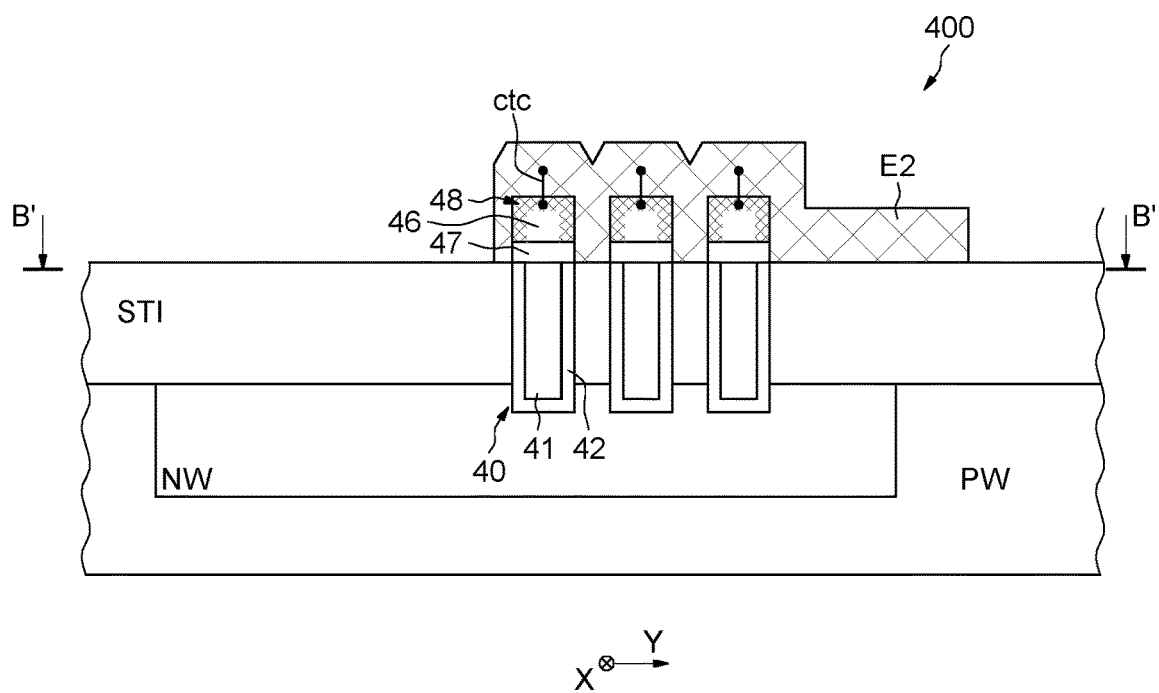

FIGS. 4A, 4B and 4C show another example of an embodiment of a filler capacitor cell 400.

FIG. 4A is a sectional view, in the plane A'A' of FIG. 4B, of the filler capacitor cell 400, FIG. 4B is a top view, in the plane B'B' of FIGS. 4A and 4C, of the filler capacitor cell 400, and FIG. 4C is a sectional view, in the plane C'C' of FIG. 4B, of the filler capacitor cell 400.

Figure 5A:
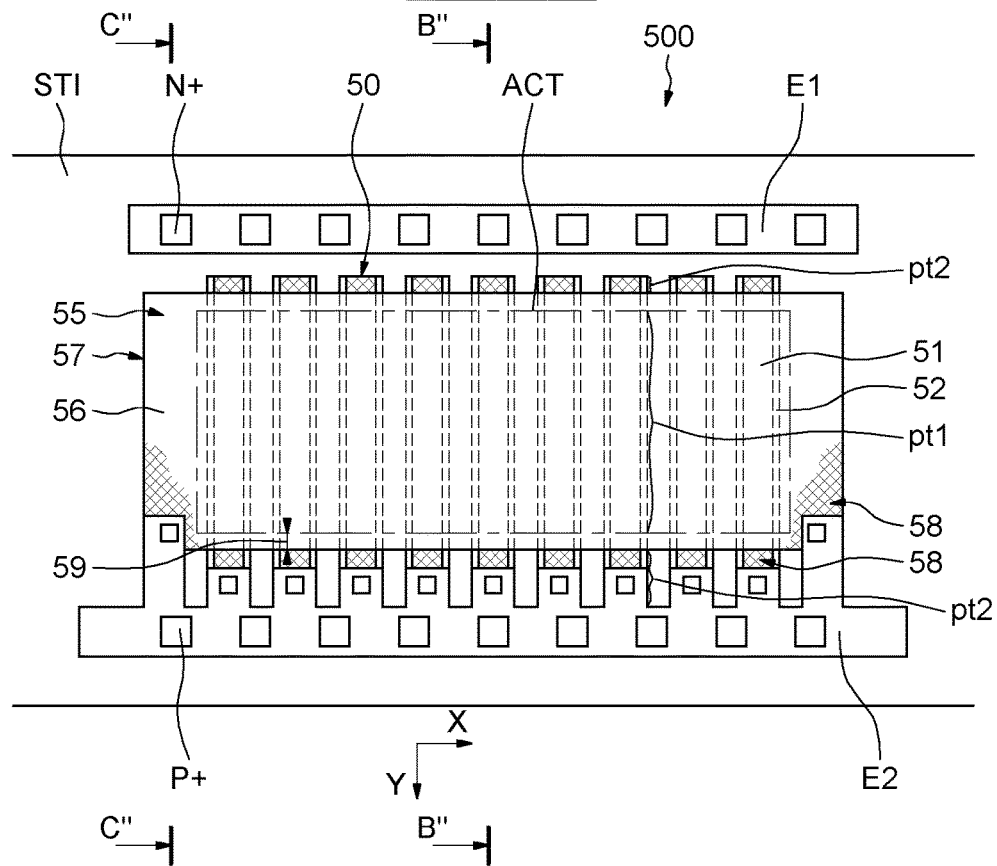
FIGS. 5A to 5C show an example of an embodiment of a filler capacitor cell.
Figure 5B:
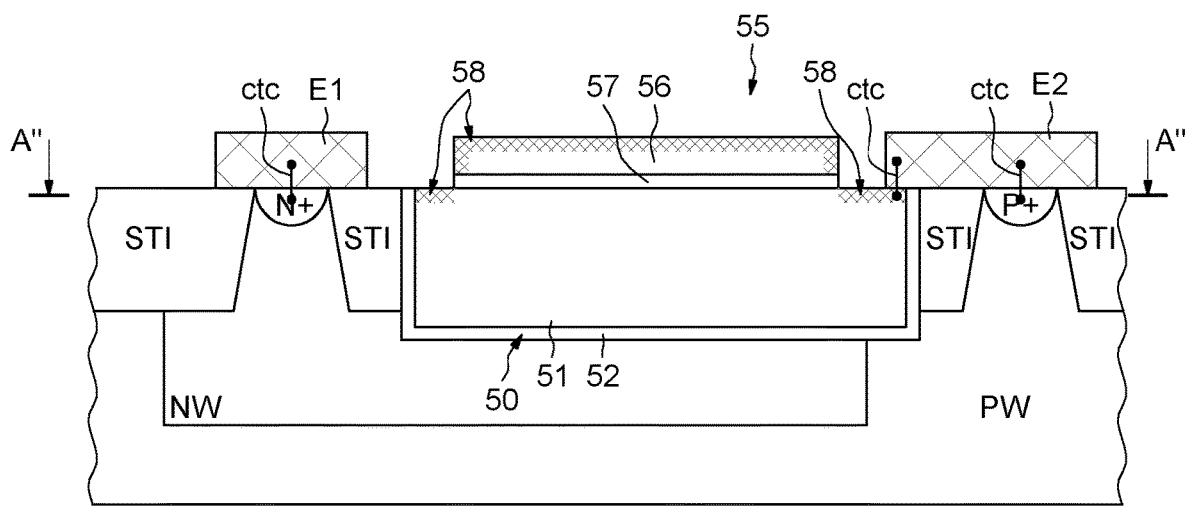
Figure 5C:
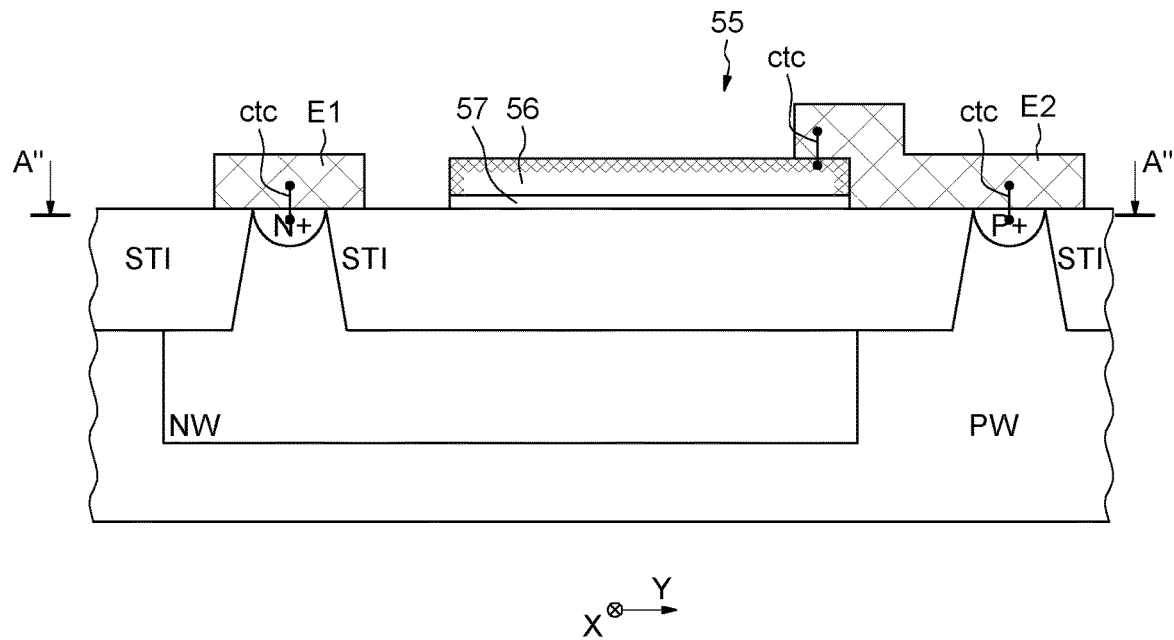

FIGS. 5A, 5B and 5C show another example of an embodiment of a filler capacitor cell 500.

FIG. 5A is a top view, in the plane A'A' of FIGS. 5B and 5C, of the filler capacitor cell 500, FIG. 5B is a sectional view, in the plane B"B" of FIG. 5A, of the filler capacitor cell 500, and FIG. 5C is a sectional view, in the plane C"C" of FIG. 5A, of the filler capacitor cell 500.

For example, the filler capacitor cells 300, 400, 500 are located in an empty space of a logic part of an integrated circuit.

A logic part of an integrated circuit may comprise an alternating series of semiconductor wells doped with a first type of conductivity NW, such as n-type, and wells PW doped with a second type of conductivity opposed to the first type of conductivity, such as p-type. The wells PW having the second type of conductivity may be the substrate, but will be denoted by the term "well" in the following text.

The wells NW and PW may be arranged in the form of a strip running along the length of the logic part (in a direction X) and may alternate laterally with one another (in a direction Y, perpendicular to the direction X). This enables logic cells to be made by complementary technology in a standard size.

The width of a logic cell of standard size, equal to 1.26 µm for example, corresponds to the width of a pair formed by a well NW and a well PW that are laterally adjacent.

Thus, the elements manufactured in the logic part, including examples of embodiments of filler capacitor cells 300, 400, 500 detailed below, have a footprint of 1.26 µm in the direction X, and, for example, a footprint varying by intervals of 0.18 µm in the direction Y. Said footprints define the standard size dimensions.

FIGS. 3A, 3B and 3C show a filler capacitor cell 300 having standard size dimensions.

In the first semiconductor well NW, a working area ACT (resembling an active region of a transistor) is delimited by a frame of isolating regions, such as a local silicon oxide (LOCOS, the usual abbreviation for "LOCal Oxidation of Silicon), or preferably shallow isolation trenches STI.

In other words, the working area ACT corresponds to a part of the well NW that is not covered by shallow isolation trenches STI.

The capacitor cell 300 comprises at least one trench 30, three trenches being present in this example, housing an electrically conductive central portion 31, enclosed by an isolating enclosure 32.

Each of the trenches 30 is located at least partially in the working area ACT, and extends into the isolating region STI. In this example, the trenches 30 extend from one side of said frame to the other, in the isolating regions STI located on either side of the working area ACT. The trenches 30 extend longitudinally in the direction X.

The trenches 30 have a structure resembling that of a buried gate of a vertical transistor. The trenches 30 may, for example, be advantageously formed during manufacturing steps that are in common with the formation of vertical transistors of another part of the integrated circuit.

For example, the electrically conductive central portion 31 is formed from polycrystalline silicon and the isolating enclosure 32 is a silicon oxide having a thickness of 8 to 10 nm.

The filler capacitor cell further comprises a cover region 35.

The cover region 35 comprises an electrically conductive layer 36 resting on a dielectric layer 37.

The electrically conductive layer 36 may be formed from polycrystalline silicon, and the dielectric layer 37 may be a silicon oxide having a thickness of 1.5 to 2.5 nm. The dielectric layer 37 may also comprise a stack of oxide-nitride-silicon oxide layers (ONO). A stack of the ONO type offers better performance as regards the reduction of the leakage current.

The electrically conductive layer 36 of the cover region 35 makes it possible, notably, to increase the capacitance of the capacitor cell device 300. This is because, with a parallel capacitive element comprising the first semiconductor region NW, the dielectric layer 37 and the electrically conductive layer 36 may thus be formed optionally and at no additional cost.

The cover region 35 covers at least a first part pt1 of the surface of the trenches 30, thus forming a mask protecting the central portions 31 of a subsequent metal silicide formation, preventing the formation of short circuits between the well NW and the central portion 31.

For practical reasons, the common term "silicidation" will be used in the following text to denote a formation of metal silicide.

In this example, the cover region 35 takes the form of a plate covering the whole surface of the working area ACT.

The cover region 35 is at least aligned with the delimitation of the working area ACT, the cover region 35 possibly extending beyond the delimitation of the working area ACT.

Thus, the first part pt1 of the surface of the trenches 30 corresponds to the part located in the working area ACT.

The trenches 30 also comprise a second part pt2 which is not covered by the cover region 35.

The joining of the first part pt1 and the second part pt2 does not necessarily form the whole of the respective trench 30.

Films of metal silicide 38 formed on the surface of the exposed semiconductor areas are represented by cross-hatching.

For example, such films of metal silicide 38 may have a thickness of about 20 to 25 nm.

Thus, the central portions 31 comprise surface areas of metal silicide 38, delimited by the cover region 35, and thus located at a distance 39 from the frame of the working area ACT.

The areas of metal silicide 38 act as contacts ctc for the conductive central portions 31 of the trenches 30 and for the conductive layer 36 of the cover region 35.

Highly doped regions P+, located on the surface of the semiconductor region having the second type of conductivity PW, act as contacts ctc for said semiconductor region PW.

For example, a second electrode E2 of the filler capacitor cell 300 comprises an electrically conductive track, electrically connecting said contacts ctc of the central portions 31, of the conductive layer 36 and of the semiconductor region having the second type of conductivity PW.

Highly doped regions N+, located on the surface of the semiconductor region having the first type of conductivity NW, act as contacts ctc with an electrically conductive track included in a first electrode E1 of the filler capacitor cell 300.

The isolating enclosure 32 enclosing the conductive central portions 31 of the trenches 30 and the dielectric layer 37 of the cover region 35 jointly form the dielectric region of the capacitor cell 300.

Such an embodiment may have a capacitance of 21 fF per standard cell (that is to say, a capacitor cell measuring 2.88 µm by 1.26 µm), for a leakage current of about 3.5 µA/nF.

FIGS. 4A, 4B and 4C show another example of an embodiment of a filler capacitor cell 400 having standard size dimensions.

In this example, a working area ACT (resembling an active region of a transistor) is delimited in the well NW by a frame of isolating regions, preferably shallow isolation trenches STI.

The capacitor cell 400 comprises at least one trench 40, three trenches being present in this example, housing an electrically conductive central portion 41, enclosed by an isolating enclosure 42.

Each of the trenches 40 is located at least partially in the working area ACT, and extends into the isolating region STI. In this example, the trenches extend longitudinally in the direction X, from one side to the other of said frame.

For example, the electrically conductive central portion 41 is formed from polycrystalline silicon and the isolating enclosure 42 is a silicon oxide having a thickness of 8 to 10 nm.

The filler capacitor cell further comprises a cover region 45.

The cover region 45 comprises an electrically conductive layer 46 resting on a dielectric layer 47.

The electrically conductive layer 46 may be formed from polycrystalline silicon, and the dielectric layer 47 may be a silicon oxide having a thickness of 1.5 to 2.5 nm. The dielectric layer 47 may also comprise a stack of oxidenitride-silicon oxide layers (ONO). A stack of the ONO type offers better performance as regards the reduction of the leakage current.

The electrically conductive layer 46 of the cover region 45 makes it possible, notably, to increase the capacitance of the capacitor cell device 400. This is because, with a parallel capacitive element comprising the first semiconductor region NW, the dielectric layer 47 and the electrically conductive layer 46 may thus be formed optionally and at no additional cost.

The cover region 45 covers at least a first part pt1 of the surface of the trenches 40, thus forming a mask protecting the central portions 41 of a subsequent metal silicidation, preventing the formation of short circuits between the well NW and the central portion 41.

In this example, the cover region 45 takes the form of strips arranged facing each trench 40 respectively.

The cover region 45 is at least aligned, in the direction of the length of the strips, with the delimitation of the working area ACT, the cover region 45 possibly extending beyond the delimitation of the working area ACT.

Similarly, the cover region 45 is at least aligned, in the direction of the width of the strips, with the delimitation of the respective central portions 41 of the trenches 40 (that is to say, with the inside of the isolating enclosure 42), the cover region 45 possibly extending beyond the delimitation of the central portions 41, being aligned for example with the outside of the isolating enclosure 42.

Thus, the first part pt1 of the surface of the trenches 40 corresponds to the part located in the working area ACT.

The trenches 40 also comprise a second part pt2 which is not covered by the cover region 45.

The joining of the first part pt1 and the second part pt2 does not necessarily form the whole of the respective trench 40.

Films of metal silicide 48 formed on the surface of the exposed semiconductor areas are represented by cross-hatching.

Thus, the central portions 41 of the second parts pt2 of said trenches 40 comprise surface areas of metal silicide 48, delimited by the cover region 45, and thus located at a distance 49 from the frame of the working area ACT.

The areas of metal silicide 48 act as contacts ctc for the conductive central portions 41 of the trenches 40 and for the conductive layer 46 of the cover region 45.

Highly doped regions P+, located on the surface of the semiconductor region having the second type of conductivity PW, act as contacts ctc for said semiconductor region PW.

For example, a second electrode E2 of the filler capacitor cell 400 comprises an electrically conductive track, electrically connecting said contacts ctc of the central portions 41, of the conductive layer 46 and of the semiconductor region having the second type of conductivity PW.

Highly doped regions N+, located on the surface of the semiconductor region having the first type of conductivity NW, act as contacts ctc with an electrically conductive track included in a first electrode E1 of the filler capacitor cell 400.

Such an embodiment may have a capacitance of 15 fF per standard cell (that is to say, a capacitor cell measuring 2.88 µm by 1.26 µm), for a leakage current of about 13 nA/nF.

FIGS. 5A, 5B and 5C show another example of an embodiment of a filler capacitor cell 500 having standard size dimensions.

In this example, a working area ACT (resembling an active region of a transistor) is delimited in the well NW by a frame of isolating regions, preferably shallow isolation trenches STI.

The capacitor cell 500 comprises at least one trench 50, seven trenches being present in this example, housing an electrically conductive central portion 51, enclosed by an isolating enclosure 52.

Each of the trenches 50 is located at least partially in the working area ACT, and extends into the isolating region STI. In this example, the trenches extend laterally in the direction Y, from one side to the other of said frame.

For example, the electrically conductive central portion 51 is formed from polycrystalline silicon and the isolating enclosure 52 is a silicon oxide having a thickness of 8 to 10 nm.

The filler capacitor cell further comprises a cover region 55.

The cover region 55 comprises an electrically conductive layer 56 resting on a dielectric layer 57.

The electrically conductive layer 56 may be formed from polycrystalline silicon, and the dielectric layer 57 may be a silicon oxide having a thickness of 1.5 to 2.5 nm. The dielectric layer 57 may also comprise a stack of oxide-nitride-silicon oxide layers (ONO). A stack of the ONO type offers better performance as regards the reduction of the leakage current.

The electrically conductive layer 56 of the cover region 55 makes it possible, notably, to increase the capacitance of the capacitor cell device 500. This is because, with a parallel capacitive element comprising the first semiconductor region NW, the dielectric layer 57 and the electrically conductive layer 56 may thus be formed optionally and at no additional cost.

The cover region 55 covers at least a first part pt1 of the surface of the trenches 50, thus forming a mask protecting the central portions 51 of a subsequent metal silicidation, preventing the formation of short circuits between the well NW and the central portion 51.

In this example, the cover region 55 takes the form of a plate covering the whole surface of the working area ACT.

The cover region 55 is at least aligned with the delimitation of the working area ACT, the cover region 55 possibly extending beyond the delimitation of the working area ACT.

Thus, the first part pt1 of the surface of the trenches 50 corresponds to the part located in the working area ACT.

The trenches 50 also comprise a second part pt2 which is not covered by the cover region 55.

The joining of the first part pt1 and the second part pt2 does not necessarily form the whole of the respective trench 50.

Films of metal silicide 58 formed on the surface of the exposed semiconductor areas are represented by cross-hatching.

Thus, the central portions 51 of the second parts pt2 of said trenches 50 comprise surface areas of metal silicide 58, delimited by the cover region 55, and thus located at a distance 59 from the frame of the working area ACT.

The areas of metal silicide 58 act as contacts ctc for the conductive central portions 51 of the trenches 50 and for the conductive layer 56 of the cover region 55.

Highly doped regions P+, located on the surface of the semiconductor region having the second type of conductivity PW, act as contacts ctc for said semiconductor region PW.

For example, a second electrode E2 of the filler capacitor cell 500 comprises an electrically conductive track, electrically connecting said contacts ctc of the central portions 51, of the conductive layer 56 and of the semiconductor region having the second type of conductivity PW.

Highly doped regions N+, located on the surface of the semiconductor region having the first type of conductivity NW, act as contacts ctc with an electrically conductive track included in a first electrode E1 of the filler capacitor cell 500.

Such an embodiment may have a capacitance of 15 fF per standard cell (that is to say, a capacitor cell measuring 2.88 µm by 1.26 µm), for a leakage current of zero.

Figure 6:
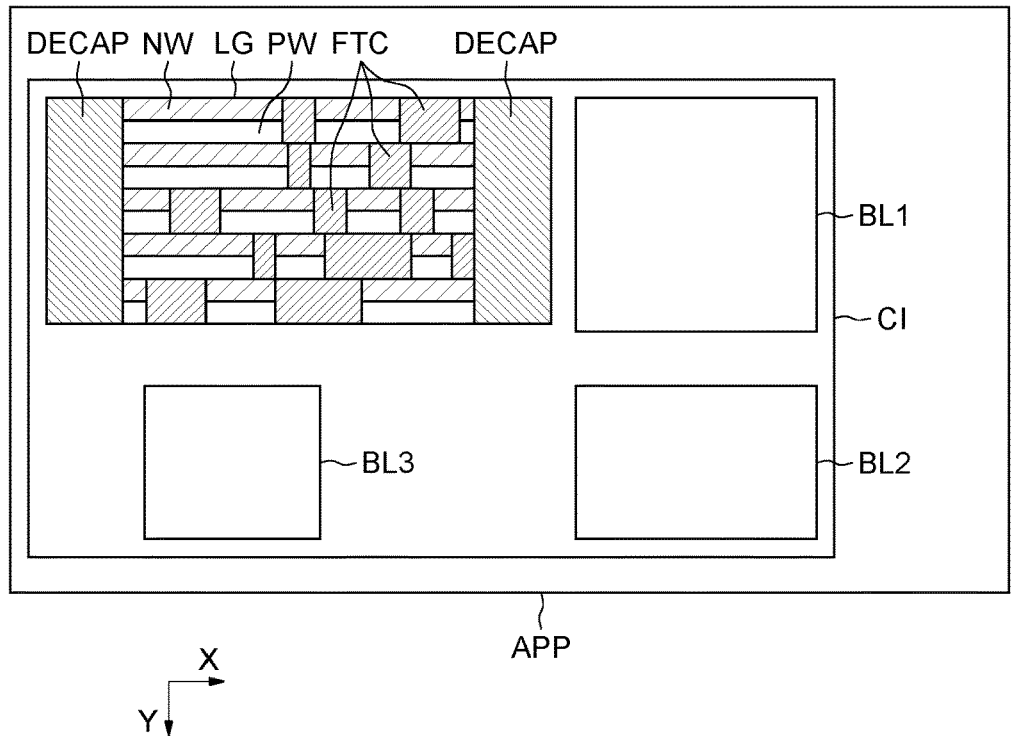
FIG. 6 shows an example of an electronic apparatus.

FIG. 6 shows an electronic apparatus APP, such as a mobile phone, an on-board computer of a vehicle, or any other known apparatus, comprising an integrated circuit CI having a domain LG comprising logic gates.

The logic part LG of the integrated circuit CI comprises a series of semiconductor wells NW having a first type of conductivity, for example n-type conductivity, and semiconductor wells PW having a second type of conductivity opposed to the first type of conductivity, for example p-type conductivity. The wells PW having the second type of conductivity may be the substrate, but will be denoted by the term "well(s)" in the following text.

The wells NW and PW are arranged in strips running along the length of the logic part (in a direction X) and may alternate laterally with one another (in a direction Y, perpendicular to the direction X). This enables logic cells to be made by complementary technology in a standard size.

The width of a logic cell of standard size, equal to 1.26 µm for example, corresponds to the width of a pair formed by a well NW and a well PW that are laterally adjacent.

The logic part LG comprises, due to its construction, spaces that are left empty (that is to say, spaces not comprising a logic cell), in which are formed filler capacitor cells FTC such as the filler capacitor cells 300, 400, 500 described above with reference to FIGS. 3 to 5.

For example, the filler capacitor cells FTC form a decoupling capacitor, operating in combination with a dedicated decoupling capacitor component DECAP.

The integrated circuit CI further comprises other functional parts BL1, BL2, BL3 such as, in an example of an integrated memory circuit CI, a memory plan, a reading amplifier and a data bus interface.

FIGS. 7A to 7F show results of steps of examples of application of a method of manufacturing filler capacitor cells.

This method is suitable for manufacturing filler capacitor cells in empty spaces of a logic circuit LG, comprising a first semiconductor region NW having a first type of conductivity, for example n-type conductivity, formed in a semiconductor substrate PW having a second type of conductivity opposed to the first type of conductivity, for example p-type conductivity.

Figure 7A:
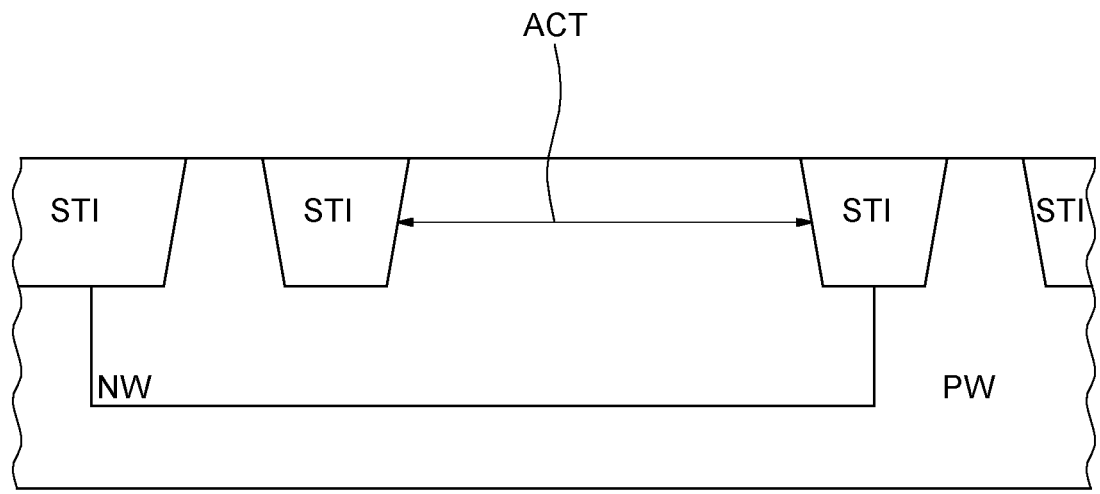
FIGS. 7A to 7F show steps of a method of manufacturing a filler capacitor cell.

FIG. 7A shows the result of a step of forming shallow isolation trenches STI which delimit, notably, a working area ACT in the first semiconductor region NW. The working area ACT corresponds to a part of the first semiconductor region NW that is not covered by shallow isolation trenches STI. The working area ACT is thus framed by isolating regions, in this example shallow isolation trenches STI.

Figure 7B:
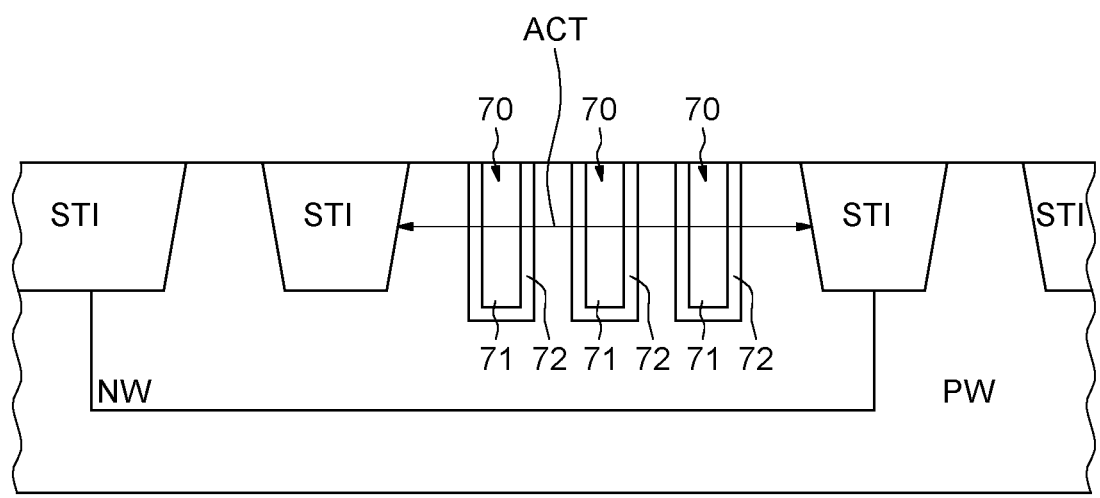

FIG. 7B shows the result of a step of forming at least one trench 70, housing an electrically conductive central portion 71, enclosed by an isolating enclosure 72. Said at least one trench 70 is formed, at least partially, in the working area ACT.

The formation of said at least one trench 70 comprises anisotropic etching, such as reactive ion etching (commonly abbreviated to as RIE), formation of an oxide by a process such as deposition or growth on the sides of the trenches thus etched, formation of the isolating enclosure 72, and damascene deposition of a conductive material to form the central portion 71.

Figure 7C:
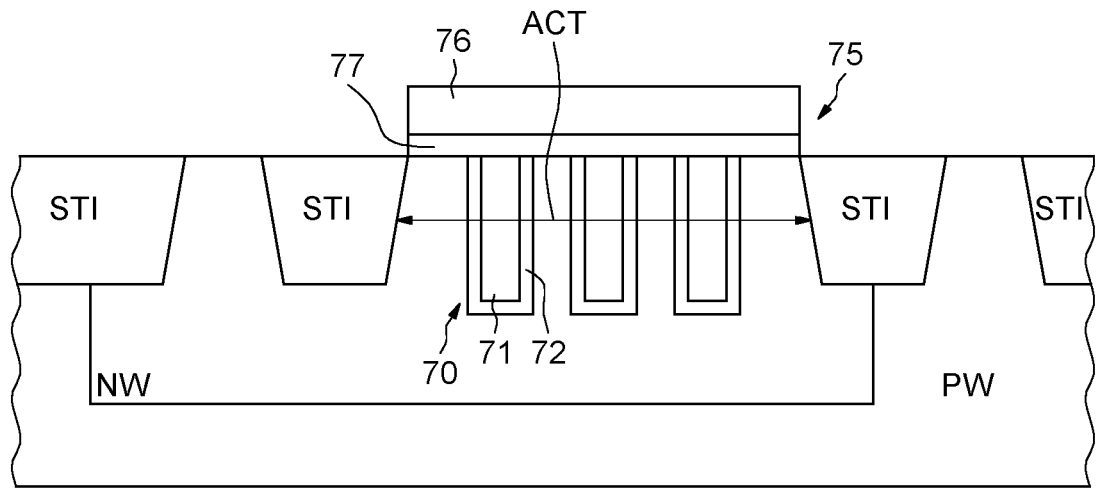
Figure 7E:
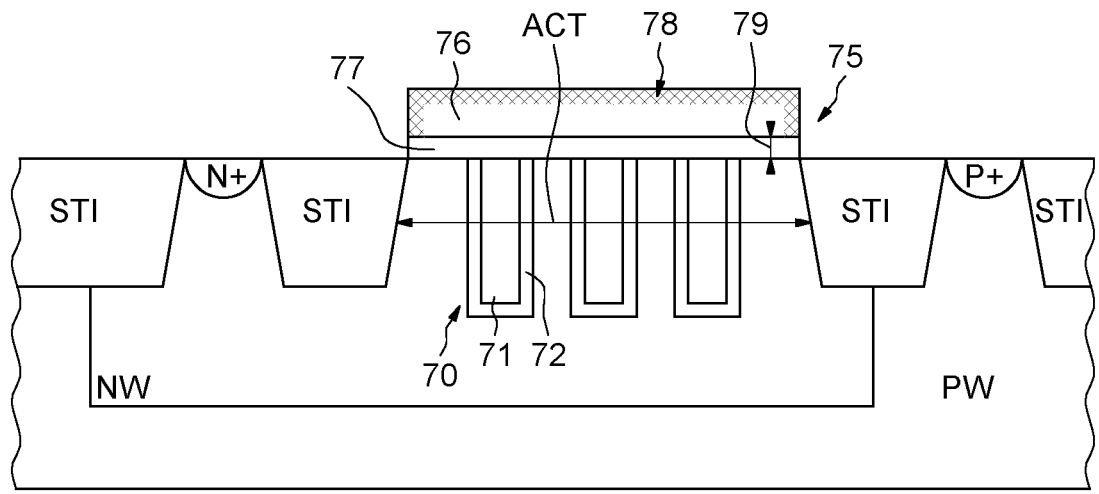
Figure 7D:
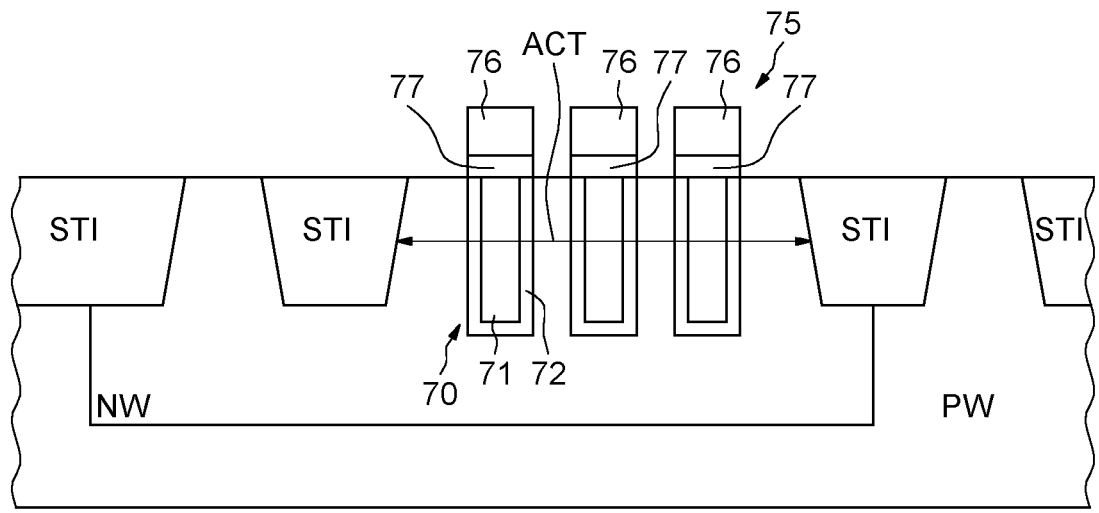

FIGS. 7C and 7D show examples of results of a step of forming at least one cover region 75 comprising an electrically conductive layer 76 resting on a dielectric layer 77. Said at least one cover region 75 totally covers the surface of a first part (pt1) of said at least one trench 70, located in the working area ACT.

For example, the formation of the dielectric layer 77 of the cover region 75 comprises the formation of a logic gate transistor gate oxide layer, or the formation of a stack of oxide-nitride-silicon oxide layers (ONO). A stack of the ONO type offers better performance as regards the reduction of the leakage current.

In the example of FIG. 7C, the formation of said at least one cover region 75 is carried out so as to form a plate covering the whole surface of the working area ACT.

In the example of FIG. 7D, the formation of said at least one cover region 75 is carried out so as to form strips arranged facing each trench 70.

Figure 7F:
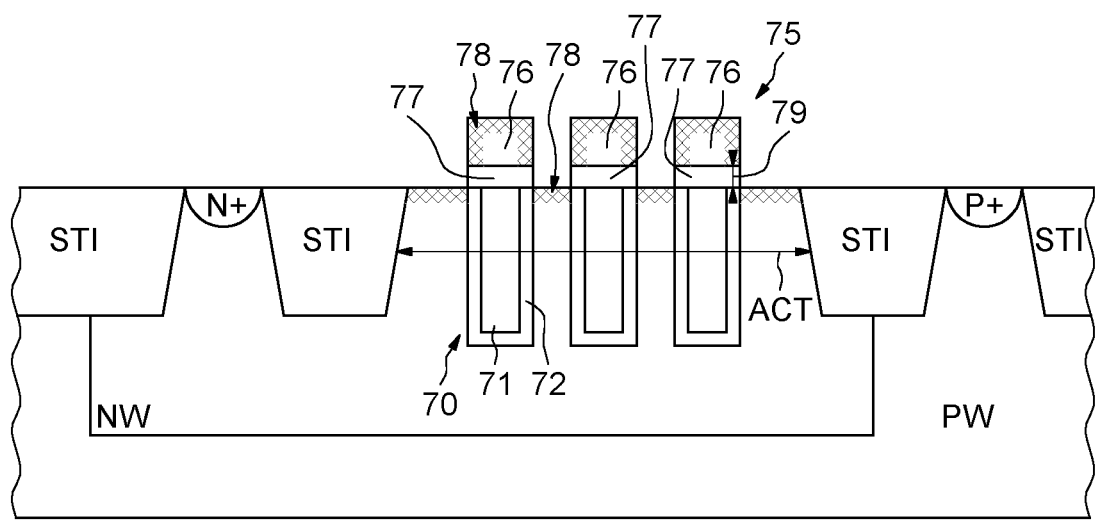

FIGS. 7E and 7F show examples of results of a step of silicidation carried out after the formation of said at least one cover region 75 on the structures described in relation to FIGS. 7C and 7D respectively.

The silicidation 78 is applied to the surfaces of the semiconductor parts of the structure being manufactured.

Thus, the method comprises, notably, silicidation 78 of a second part (pt2) of said central portion 71, this silicidation 78 being delimited by said cover region 75.

This delimitation of the silicidation at a distance 79 from the working area ACT operates in the same way as a hard mask to prevent the formation of short circuits, notably, between the conductive central portions 71 of the trenches 70 and the first semiconductor region NW.

On the other hand, the invention is not limited to these embodiments, but includes all variants thereof; for example, the numerical values and natures of the materials have been given by way of example, and furthermore the various arrangements of the examples of embodiment described above, particularly the arrangements of the trenches and the cover regions, may be combined independently from one embodiment to another without departing from the scope of the invention.

The invention claimed is:

1. An integrated circuit, comprising:
a first semiconductor region;
an isolating region laterally surrounding a semiconductor working area of the first semiconductor region;
at least one trench including a first trench portion located in the semiconductor working area and a second trench portion laterally extending from the first trench portion and located in the isolating region, the first and second trench portions filled by an electrically conductive central portion enclosed in an isolating enclosure;
a cover region covering a first part of said filled first trench portion located in the working area, the cover region comprising at least one dielectric layer in contact with a top surface of the electrically conductive central portion in the first part of said filled first trench portion;
a layer of metal silicide located on the top surface of the electrically conductive central portion of a second part of said filled second trench portion which is located in the isolating region and which is not covered by the at least one dielectric layer of said cover region;

a first contact in the first semiconductor region forming a first electrode of a filler capacitor cell device; and a second contact on the metal silicide layer forming a second electrode of the filler capacitor cell device.

2. The integrated circuit according to claim 1, wherein said first semiconductor region is a semiconductor well within a semiconductor substrate and wherein the filler capacitor cell device further comprises a substrate contact electrically connected to the second contact.

3. The integrated circuit according to claim 1, wherein the cover region further comprises an electrically conductive layer in contact with a top surface of said at least one dielectric layer, wherein the electrically conductive layer is electrically connected to the second contact.

4. The integrated circuit according to claim 1, wherein said at least one dielectric layer of the cover region comprises a transistor gate oxide layer.

5. The integrated circuit according to claim 1, wherein said at least one dielectric layer of the cover region comprises a stack of silicon oxide-nitride-silicon oxide layers.

6. The integrated circuit according to claim 1, wherein said at least one trench comprises a plurality trenches arranged to extend in parallel with each other in the semiconductor working area and laterally extend in the isolation region.

7. The integrated circuit according to claim 1, wherein said cover region has a shape of a plate which covers a whole upper surface of the semiconductor working area.

8. The integrated circuit according to claim 1, wherein the cover region has a shape of a strip which covers each filled trench without covering portions of the semiconductor working area between strips.

9. The integrated circuit according to claim 8, further comprising a metal silicide layer located on the surface of the semiconductor working area between the strips.

10. The integrated circuit according to claim 1, wherein the first semiconductor region is located within a circuit domain that includes logic gates.

11. The integrated circuit according to claim 10, wherein the circuit domain includes a plurality of semiconductor wells with each semiconductor well including the first semiconductor region so as to provide for a corresponding plurality of filler capacitor cell devices that are located between logic gates.

12. The integrated circuit according to claim 10, wherein the logic gates are part of a logic circuit of an electronic apparatus, the electronic apparatus selected from a group consisting of a mobile phone or a computer.

13. An integrated circuit, comprising:

a semiconductor region laterally surrounded by an isolating region;

a trench including a first part located in the semiconductor region and a second part laterally extending from said first part into the isolating region, wherein the trench is filled by an electrically conductive central portion isolated by an isolating layer;

a dielectric layer in contact with a top surface of the electrically conductive central portion of said filled trench and extending to cover said a first part of said filled trench;

a metal silicide layer located on the electrically conductive central portion of said second part of said filled trench, the second part of said filled trench being not covered by the dielectric layer;

a first contact in the first semiconductor region forming a first electrode of a filler capacitor cell device; and a second contact on the metal silicide layer of the central portion of the second part of said trench forming a second electrode of the filler capacitor cell device.

14. The integrated circuit according to claim 13, wherein said semiconductor region is a semiconductor well and wherein the filler capacitor cell device further comprises a substrate contact electrically connected to the second contact.

15. The integrated circuit according to claim 13, further comprising an electrically conductive layer in contact with a top surface of said dielectric layer, wherein the electrically conductive layer is electrically connected to the second contact.

16. The integrated circuit according to claim 13, wherein said dielectric layer comprises a transistor gate oxide layer.

17. The integrated circuit according to claim 13, wherein said dielectric layer comprises a stack of silicon oxide-nitride-silicon oxide layers.

* * * * *